US011222872B2

(12) United States Patent
Lee et al.

(10) Patent No.: US 11,222,872 B2
(45) Date of Patent: Jan. 11, 2022

(54) SEMICONDUCTOR PACKAGE INCLUDING STACKED SEMICONDUCTOR CHIPS

(71) Applicant: SK hynix Inc., Icheon-si (KR)

(72) Inventors: Chae-Sung Lee, Icheon-si (KR); Bok-Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/867,348

(22) Filed: May 5, 2020

(65) Prior Publication Data

US 2021/0074679 A1     Mar. 11, 2021

(30) Foreign Application Priority Data

Sep. 6, 2019  (KR) .......................... 10-2019-0110687

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/0651* (2013.01);
(Continued)

(58) Field of Classification Search
CPC ................. H01L 25/0657; H01L 25/50; H01L 2225/0651; H01L 2225/06562; H01L 2225/06586
See application file for complete search history.

(56) References Cited

U.S. PATENT DOCUMENTS 10,128,211 B2   11/2018  Chang et al.
2015/0115476 A1*  4/2015  Chen ....................... H01L 23/13
                                                            257/777

(Continued)

FOREIGN PATENT DOCUMENTS

KR      1020170070779 A      6/2017

OTHER PUBLICATIONS

Chandrasekharan Nair et al., "Effect of Ultra-Fine Pitch RDL Process Variations on the Electrical Performance of 2.5D Glass Interposers up to 110 GHz", 2016 IEEE 66th Electronic Components and Technology Conference, pp. 2408-2413, Las Vegas, NV, USA.

*Primary Examiner* — Timor Karimy
(74) *Attorney, Agent, or Firm* — William Park & Associates Ltd.

(57) ABSTRACT

A semiconductor package may include: a first chip stack including a plurality of first semiconductor chips stacked in a vertical direction; and first vertical interconnectors electrically coupled to the plurality of first semiconductor chips, respectively, and extended in the vertical direction, wherein each of the other first semiconductor chips, except at least the uppermost first semiconductor chip from among the plurality of first semiconductor chips includes: an active surface defined by two side surfaces of the first semiconductor chip in a first direction and two side surfaces of the first semiconductor chip in a second direction crossing the first direction; a first one-side chip pad disposed at an edge of the active surface, which is close to one side surface in the first direction; a first other-side chip pad disposed at an edge of the active surface, which is close to an other side surface in the first direction; and a first redistribution pad electrically coupled to the first other-side chip pad, and disposed at an edge of the active surface, which is close to one side surface in the second direction, wherein the plurality of first semiconductor chips are stacked with an offset toward one side in a third direction crossing the first and second directions, the one side being away from the one side surface in the first direction and the one side surface in the second direction, in order to expose the first one-side chip pads and the first redistribution pads, wherein the first vertical interconnectors electrically coupled to the first semiconductor chips have (Continued)

one ends connected to the first one-side chip pads and the first redistribution pads, respectively.

20 Claims, 13 Drawing Sheets

(52) U.S. Cl.
CPC ............ *H01L 2225/06562* (2013.01); *H01L 2225/06586* (2013.01)

(56) References Cited

U.S. PATENT DOCUMENTS

2015/0200187 A1\* 7/2015 Park .................. H01L 24/49
257/777
2020/0075551 A1\* 3/2020 Oh .................... H01L 24/14

\* cited by examiner

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0110687 filed on Sep. 6, 2019, which is incorporated herein by reference in its entirety.

BACKGROUND

1. Technical Field

The present disclosure generally relates to a semiconductor package, and more particularly, to a semiconductor package including a plurality of chips stacked therein.

2. Related Art

Electronic products are required to process a larger amount of data while having a smaller volume. Thus, it is necessary to increase the degree of integration of a semiconductor device used in such electronic products.

However, due to the limitations of the semiconductor integration technology, required functions cannot be satisfied by only a single semiconductor chip. Thus, a semiconductor package having a plurality of semiconductor chips embedded therein is fabricated.

Although a semiconductor package includes a plurality of semiconductor chips, the semiconductor package is required to have a designated size or a size smaller than the designated size, according to the requirements of an application in which the semiconductor package is to be mounted.

SUMMARY

In an embodiment, a semiconductor package may include: a first chip stack including a plurality of first semiconductor chips stacked in a vertical direction; and first vertical interconnectors electrically coupled to the plurality of first semiconductor chips, respectively, and extended in the vertical direction, wherein each of the other first semiconductor chips, except at least the uppermost first semiconductor chip from among the plurality of first semiconductor chips includes: an active surface defined by two side surfaces of the first semiconductor chip in a first direction and two side surfaces of the first semiconductor chip in a second direction crossing the first direction; a first one-side chip pad disposed at an edge of the active surface, which is close to one side surface in the first direction; a first other-side chip pad disposed at an edge of the active surface, which is close to an other side surface in the first direction; and a first redistribution pad electrically coupled to the first other-side chip pad, and disposed at an edge of the active surface, which is close to one side surface in the second direction, wherein the plurality of first semiconductor chips are stacked with an offset toward one side in a third direction crossing the first and second directions, the one side being away from the one side surface in the first direction and the one side surface in the second direction, in order to expose the first one-side chip pads and the first redistribution pads, wherein the first vertical interconnectors electrically coupled to the first semiconductor chips have one ends connected to the first one-side chip pads and the first redistribution pads, respectively.

In an embodiment, a semiconductor package may include: a first chip stack including a plurality of first semiconductor chips stacked in a vertical direction; first vertical interconnectors electrically coupled to the plurality of first semiconductor chips, respectively, and extended in the vertical direction; a second chip stack disposed on the first chip stack, and including a plurality of second semiconductor chips stacked in the vertical direction, the second semiconductor chips including other second semiconductor chips and an uppermost second semiconductor chip; and second vertical interconnectors electrically coupled to the plurality of second semiconductor chips, respectively, and extended in the vertical direction. Each of the first semiconductor chips may include: an active surface defined by two side surfaces of the first semiconductor chip in a first direction and two side surfaces of the first semiconductor chip in a second direction crossing the first direction; a first one-side chip pad disposed at an edge of the active surface, which is close to one side surface in the first direction; an first other-side chip pad disposed at an edge of the active surface, which is close to the other side surface in the first direction; and a first redistribution pad electrically coupled to the first other-side chip pad and disposed at an edge of the active surface, which is close to one side surface between the two side surfaces in the second direction. The plurality of first semiconductor chips may be stacked with an offset toward one side in a third direction crossing the first and second directions, the one side being spaced away from the one side surface in the first direction and the one side surface in the second direction, in order to expose the first one-side chip pad and the first redistribution pad. Each of the first vertical interconnectors may have one end connected to the first one-side chip pad and the first redistribution pad. The other second semiconductor chips except at least the uppermost second semiconductor chip among the plurality of second semiconductor chips may be disposed in the same state as the state in which the first semiconductor chips are but rotated by 180 degrees about one axis parallel to the vertical direction, and each include a second one-side chip pad, a second other-side chip pad and a second redistribution pad which are located at the opposite positions of the positions of the first one-side chip pad, the first other-side chip pad and the first redistribution pad. The plurality of second semiconductor chips may be stacked with an offset in the opposite direction of the offset stacking direction of the plurality of first semiconductor chips, in order to expose the second one-side chip pads and the second redistribution pads of the other second semiconductor chips. Each of the second vertical interconnectors electrically coupled to the other second semiconductor chips may have one end connected to the second one-side chip pad and the second redistribution pad.

In an embodiment, a method of fabricating a semiconductor package may include: forming a first chip stack on a carrier substrate, the first chip stack including a plurality of first semiconductor chips stacked in a vertical direction; and forming first vertical interconnectors electrically coupled to the plurality of first semiconductor chips, respectively, and extended in the vertical direction. Each of the other first semiconductor chips except at least the uppermost first semiconductor chip from among the plurality of first semiconductor chips may include: an active surface defined by two side surfaces thereof in a first direction and two side surfaces thereof in a second direction crossing the first direction; a first one-side chip pad disposed at an edge of the active surface, which is close to one side surface in the first direction; a first other-side chip pad disposed at an edge of the active surface, which is close to the other side surface in the first direction; and a first redistribution pad electrically coupled to the first other-side chip pad, and disposed at an edge of the active surface, which is close to one side surface between the two side surfaces in the second direction. The forming of the first chip stack may include stacking the first semiconductor chips with an offset toward one side in a third direction crossing the first and second directions, the one side being spaced away from the one side surface in the first direction and the one side surface in the second direction, in order to expose the first one-side chip pad and the first redistribution pad.

In an embodiment, a method of fabricating a semiconductor package may include: forming a first chip stack on a carrier substrate, the first chip stack including a plurality of first semiconductor chips stacked in a vertical direction; forming a second chip stack on the first chip stack, the second chip stack including a plurality of second semiconductor chips stacked in the vertical direction, the second semiconductor chips including other second semiconductor chips and an uppermost second semiconductor chip; and forming first vertical interconnectors electrically coupled to the plurality of first semiconductor chips, respectively, and extended in the vertical direction and second vertical interconnectors electrically coupled to the plurality of second semiconductor chips, respectively, and extended in the vertical direction. Each of the first semiconductor chips may include: an active surface defined by two side surfaces thereof in a first direction and two side surfaces thereof in a second direction crossing the first direction; a first one-side chip pad disposed at an edge of the active surface, which is close to one side surface in the first direction; a first other-side chip pad disposed at an edge of the active surface, which is close to the other side surface in the first direction; and a first redistribution pad electrically coupled to the first other-side chip pad and disposed at an edge of the active surface, which is close to one side surface between the two side surfaces in the second direction. The other second semiconductor chips except at least the uppermost second semiconductor chip among the plurality of second semiconductor chips may be disposed in the same state as the state in which the first semiconductor chips are but rotated by 180 degrees about one axis parallel to the vertical direction, and each include a second one-side chip pad, a second other-side chip pad and a second redistribution pad which are located at the opposite positions of the positions of the first one-side chip pad, the first other-side chip pad and the first redistribution pad. The forming of the first chip stack may include stacking the first semiconductor chips with an offset toward one side in a third direction crossing the first and second directions, the one side being spaced away from the one side surface in the first direction and the one side surface in the second direction, in order to expose the first one-side chip pad and the first redistribution pad. The forming of the second chip stack may include stacking the second semiconductor chips with an offset in the opposite direction of the offset-stacking direction of the plurality of second semiconductor chips, in order to expose the second one-side chip pads and the second redistribution pads of the other second semiconductor chips.

DETAILED DESCRIPTION

Figure 1A:
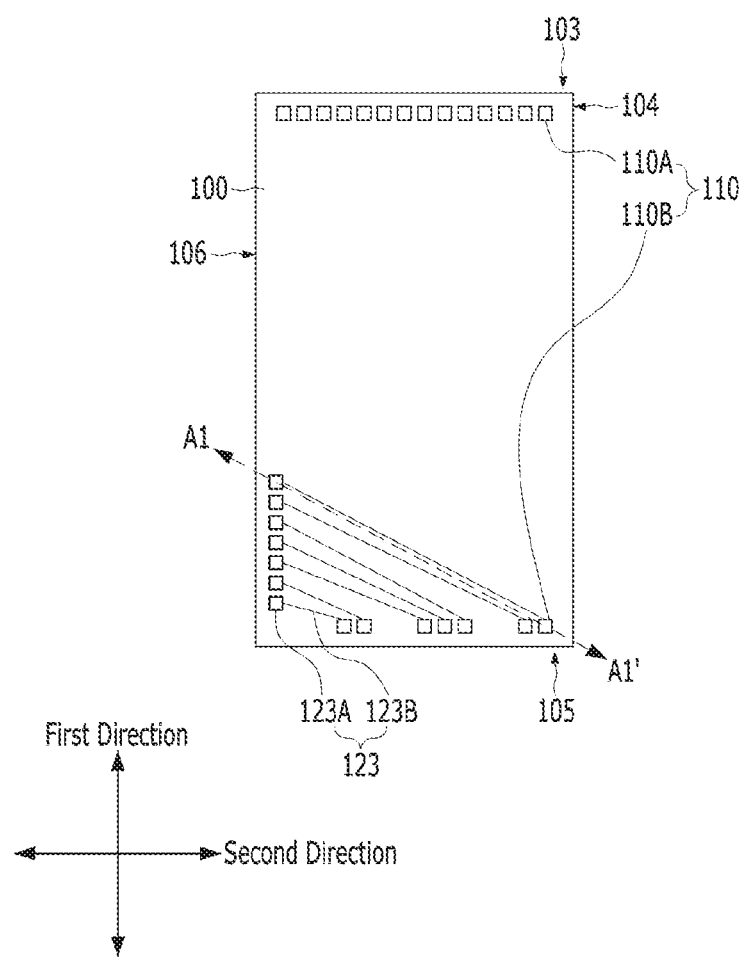
FIG. 1A is a plan view illustrating an active surface of a semiconductor chip in accordance with an embodiment.

Various examples and implementations of the disclosed technology are described below with reference to the accompanying drawings.

The drawings might not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments are directed to a semiconductor package which has a small thickness and can satisfy high-performance and high-capacity requirements through a method for stacking a plurality of semiconductor chips each having chip pads disposed at both edges thereof.

Before a semiconductor package and a method for fabricating the same in accordance with an embodiment are described, a semiconductor chip included in the semiconductor package in accordance with a present embodiment will be described with reference to FIGS. 1A and 1B.

Figure 1B:
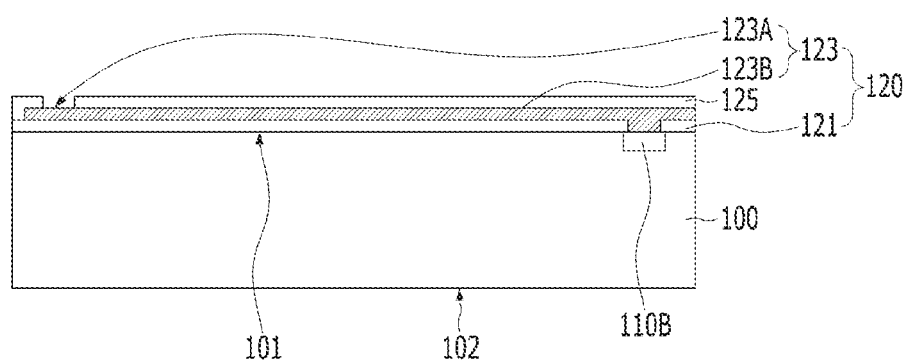
FIG. 1B is a cross-sectional view taken along a line A1-A1' of FIG. 1A.

FIG. 1A is a plan view illustrating an active surface of a semiconductor chip in accordance with an embodiment, and FIG. 1B is a cross-sectional view taken along a line A1-A1' of FIG. 1A.

Referring to FIGS. 1A and 1B, the semiconductor chip 100 in accordance with an embodiment may include an active surface 101 having chip pads 110 disposed thereon, an inactive surface 102 located on the opposite side of the active surface 101, and side surfaces 103, 104, 105, and 106 connecting the active surface 101 and the inactive surface 102.

Since the semiconductor chip 100 has a rectangular plan shape or a similar shape thereto, the semiconductor chip 100 may include the four side surfaces 103 to 106. Among the side surfaces 103 to 106, the side surfaces 103 and 105 facing each other in a first direction parallel to the active surface 101 and/or the inactive surface 102 of the semiconductor chip 100 will be referred to as a first side surface 103 and a third side surface 105, and the side surfaces 104 and 106 facing each other in a second direction which crosses the first direction while being parallel to the active surface 101 and/or the inactive surface 102 of the semiconductor chip 100 will be referred to as a second side surface 104 and a fourth side surface 106. In an embodiment, the first and third side surfaces 103 and 105 may have a smaller length than the second and fourth side surfaces 104 and 106. However, the present embodiments are not limited thereto, and the lengths of the side surfaces may be set to various values.

The chip pads 110 may be disposed at both edge areas of the active surface 101 in the first direction, i.e. the edge area adjacent to the first side surface 103 and the edge area adjacent to the third side surface 105. That is, the chip pads 110 may be disposed in an edge-pad type. Among the chip pads 110, the chip pads 110 disposed at the edge area close to the first side surface 103 will be referred to as one-side chip pads 110A, and the chip pads 110 disposed at the edge area close to the third side surface 105 will be referred to as other-side chip pads 110B. In an embodiment, the one-side chip pads 110A may be arranged in a line along the second direction, and the other-side chip pads 110B may also be arranged in a line along the second direction. However, the present embodiments are not limited thereto, and the one-side chip pads 110A and/or the other-side chip pads 110B may be arranged in various manners at both edge areas in the first direction. In an embodiment, the number of the one-side chip pads 110A may be larger than the number of the other-side chip pads 110B. However, the present embodiments are not limited thereto, and the number of the one-side chip pads 110A and the number of the other-side chip pads 110B may be set to various values. In an embodiment, the chip pads 110 may have a rectangular plan shape. However, the present embodiments are not limited thereto, and the plan shape of the chip pads 110 may be modified in various manners.

When such semiconductor chips 100 are stacked in a vertical direction, it is difficult to expose the one-side chip pads 110A and the other-side chip pads 110B at the same time, even though the semiconductor chips 100 are stacked through any methods. This will be described below. In order to solve such a problem, the semiconductor chip 100 may further include a chip redistribution layer 120 formed on the active surface 101.

The chip redistribution layer 120 may include redistribution dielectric layers 121 and 125 and a redistribution conductive layer 123.

For example, the redistribution conductive layer 123 may include redistribution pads 123A and redistribution lines 123B which are located on a plane illustrated in FIG. 1A. The redistribution pads 123A may be disposed at an edge area close to the fourth side surface 106 between both edge areas in the second direction, and the redistribution lines 123B may be extended from the redistribution pads 123A to the other-side chip pads 110B. In an embodiment, the redistribution pads 123A may be arranged in a line along the first direction while the number of the redistribution pads 123A is set to the same value as the number of the other-side chip pads 110B such that the redistribution pads 123A one-to-one correspond to the other-side chip pads 110B. However, the present embodiments are not limited thereto, but the number and arrangement of the redistribution pads 123A may be modified in various manners. In an embodiment, the redistribution pads 123A may be disposed at the edge area close to the fourth side surface 106. However, the present embodiments are not limited thereto, but the redistribution pads 123A may be disposed at the edge area close to the second side surface 104. The edge area where the redistribution pads 123A are disposed, between both edge areas in the second direction, may be decided according to an offset stacking direction of the semiconductor chip 100 which will be described below. In an embodiment, the redistribution pads 123A may be electrically coupled to the other-side chip pads 110B. However, the present embodiments are not limited thereto, but the redistribution pads 123A may be electrically coupled to the one-side chip pads 110A. The chip pads to which the redistribution pads 123A are connected, between the one-side chip pads 110A and the other-side chip pads 110B, may be decided according to the offset stacking direction of the semiconductor chip 100 which will be described below. When the redistribution pads 123A are electrically coupled to the other-side chip pads 110B, the redistribution pads 123A may be disposed relatively close to the third side surface 105 in the first direction as illustrated in FIG. 1A, which makes it possible to shorten connection paths to the other-side chip pads 110B. On the other hand, when the redistribution pads 123A are connected to the one-side chip pads 110A, the redistribution pads 123A may be disposed relatively close to the first side surface 103 in the first direction in the opposite way of the illustrated structure. When the redistribution pads 123A are connected to the other-side chip pads 110B fewer than the one-side chip pads 110A, a routing path through the chip redistribution layer 120 and a package redistribution layer 600 (see FIG. 7) to be described below can be relatively simplified. In an embodiment, the redistribution pads 123A may have the same or similar rectangular plan shape as or to the chip pads 110. For convenience of description, the redistribution pads 123A are represented by thicker solid lines than the chip pads 110. However, the present embodiments are not limited thereto, and the plan shape of the redistribution pads 123A may be modified in various manners. The redistribution lines 123B may be formed not to cross each other. For this structure, the redistribution pads 123A and the other-side chip pads 110B may be respectively connected to each other in ascending order of distance therebetween.

Referring to the cross-section illustrated in FIG. 1B, the redistribution conductive layer 123 may be covered by the redistribution dielectric layers 121 and 125, except portions exposed through openings of the redistribution dielectric layers 121 and 125, and thus electrically isolated from other components. The first redistribution dielectric layer 121 covering the active surface 101 of the semiconductor chip 100 may have openings that expose the chip pads 110. The redistribution lines 123B may fill the openings of the first redistribution dielectric layer 121 to be electrically coupled to the chip pads 110, and extended over the first redistribution dielectric layer 121. The redistribution line 123B may be extended in a line shape with a small width, and have an end with a relatively large width. The second redistribution dielectric layer 125 may have an opening to expose the ends of the redistribution lines 123B, while covering the redistribution lines 123B and the first redistribution dielectric layer 121. Portions of the ends of the redistribution lines 123B, exposed through the openings formed in the second redistribution dielectric layer 125, may constitute the redistribution pads 123A.

The semiconductor chip 100 in accordance with an embodiment may include a mobile dynamic random access memory (DRAM). However, the present embodiments are not limited thereto, but the semiconductor chip 100 may include a nonvolatile memory such as a flash memory, a phase change RAM (PRAM) or a magneto-resistive RAM (MRAM) or a volatile memory such as a DRAM or a static RAM (SRAM).

The above-described plurality of semiconductor chips 100 may be stacked in a vertical direction to form a semiconductor package. This structure will be described with reference to FIGS. 2A, 2B, 3A, 3B, 4A, 4B, 5A, 5B, 6 and 7.

Figure 4A:
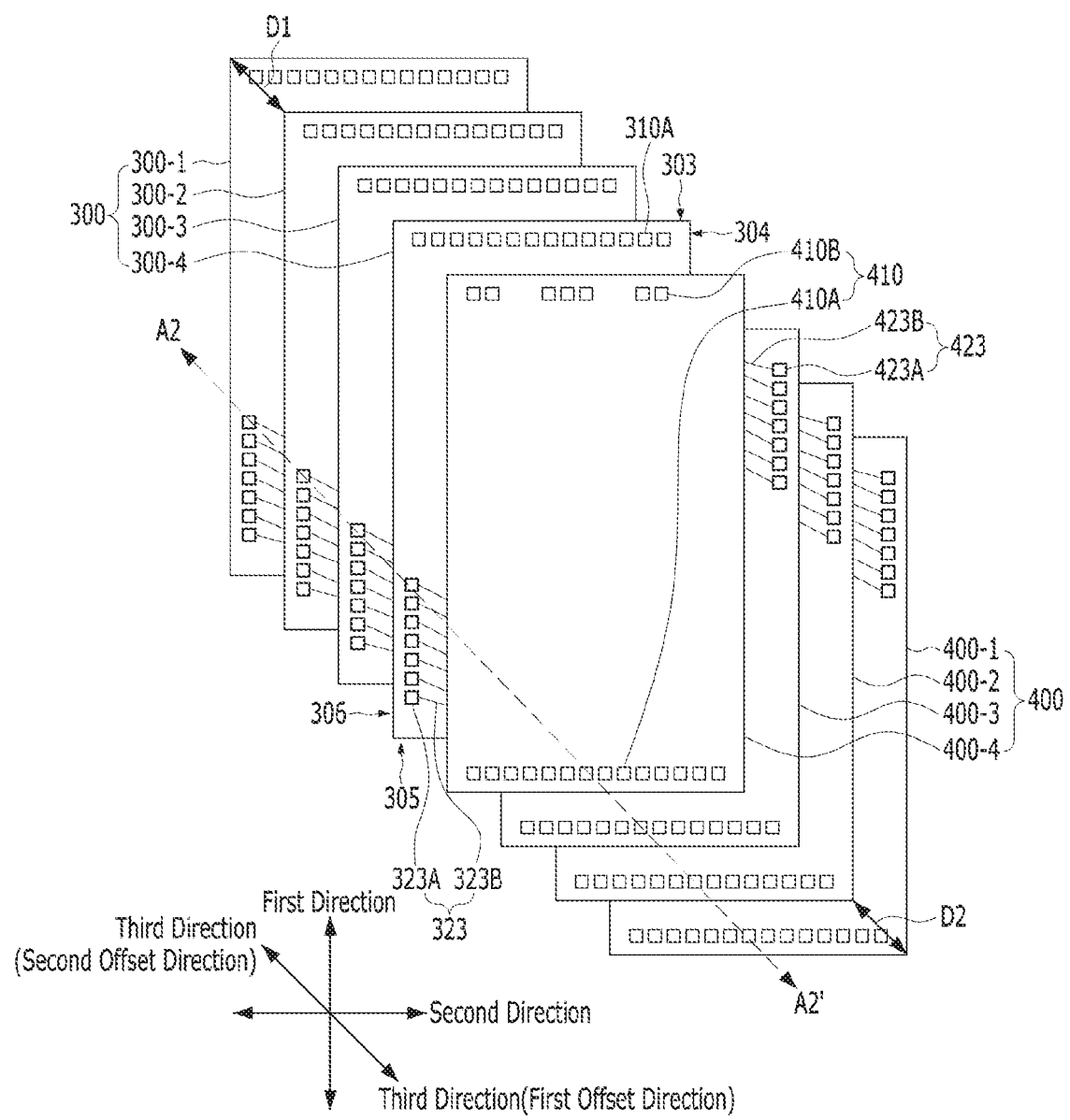
Figure 4B:
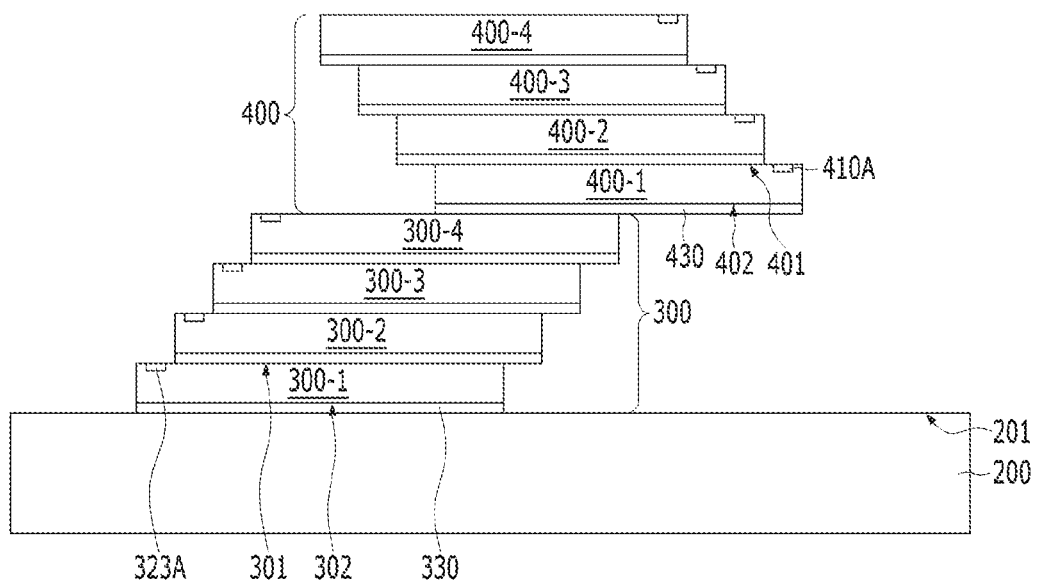
Figure 5A:
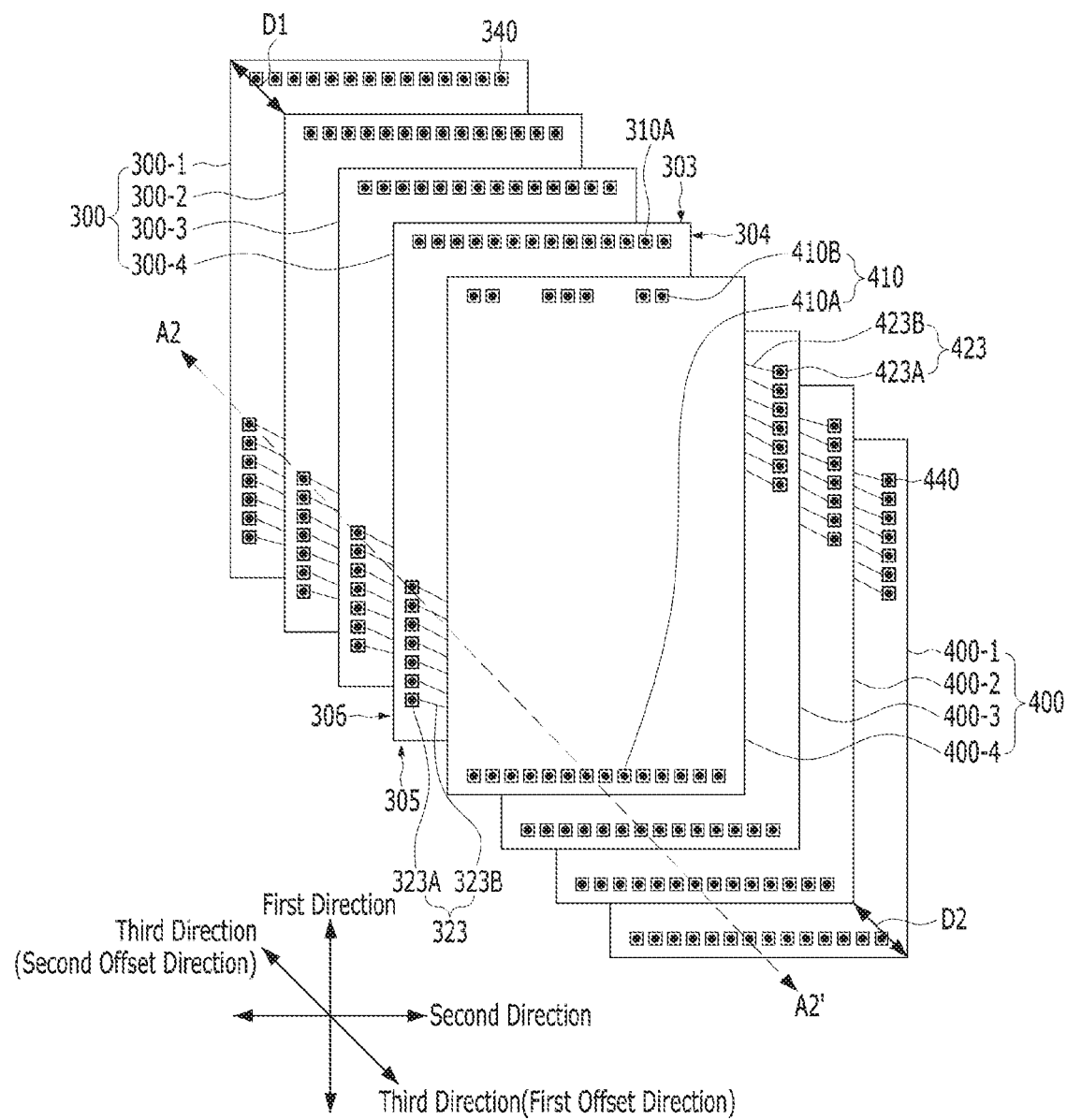
Figure 5B:
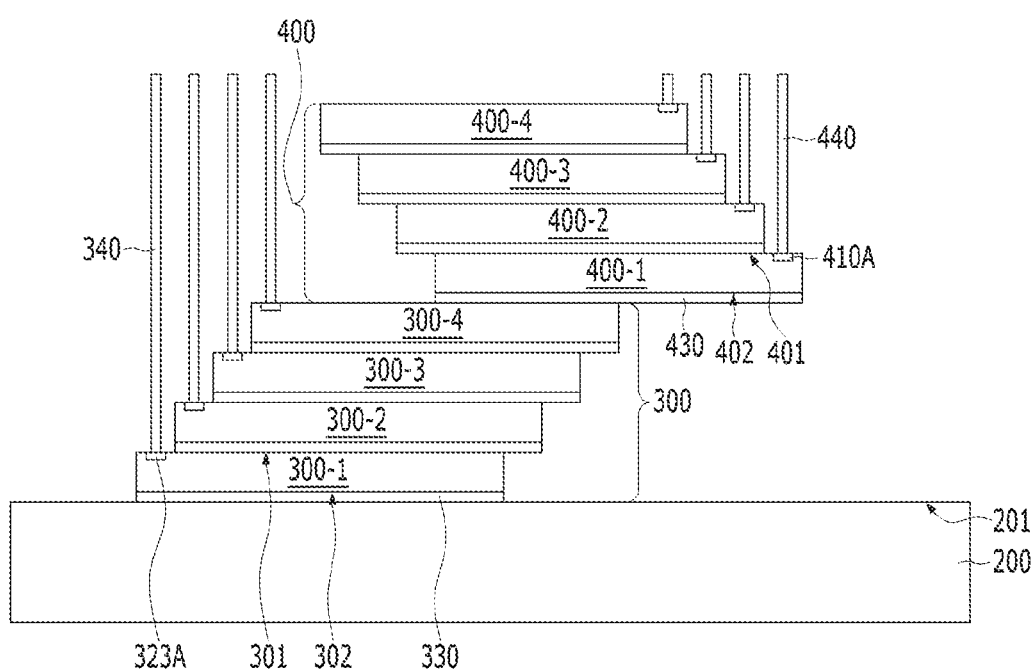
Figure 6:
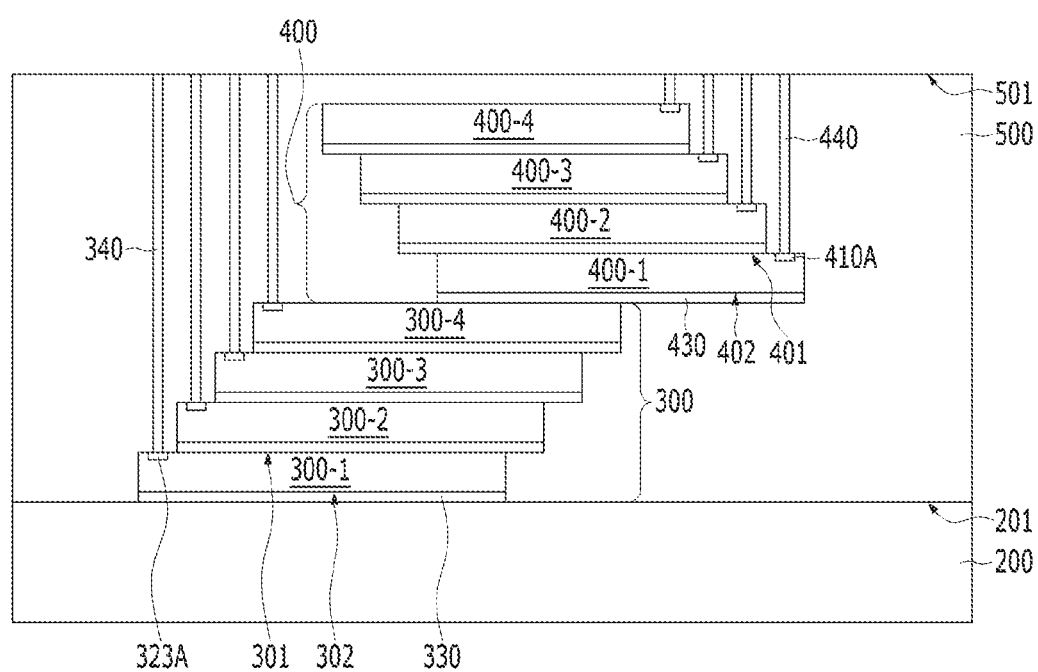
Figure 7:
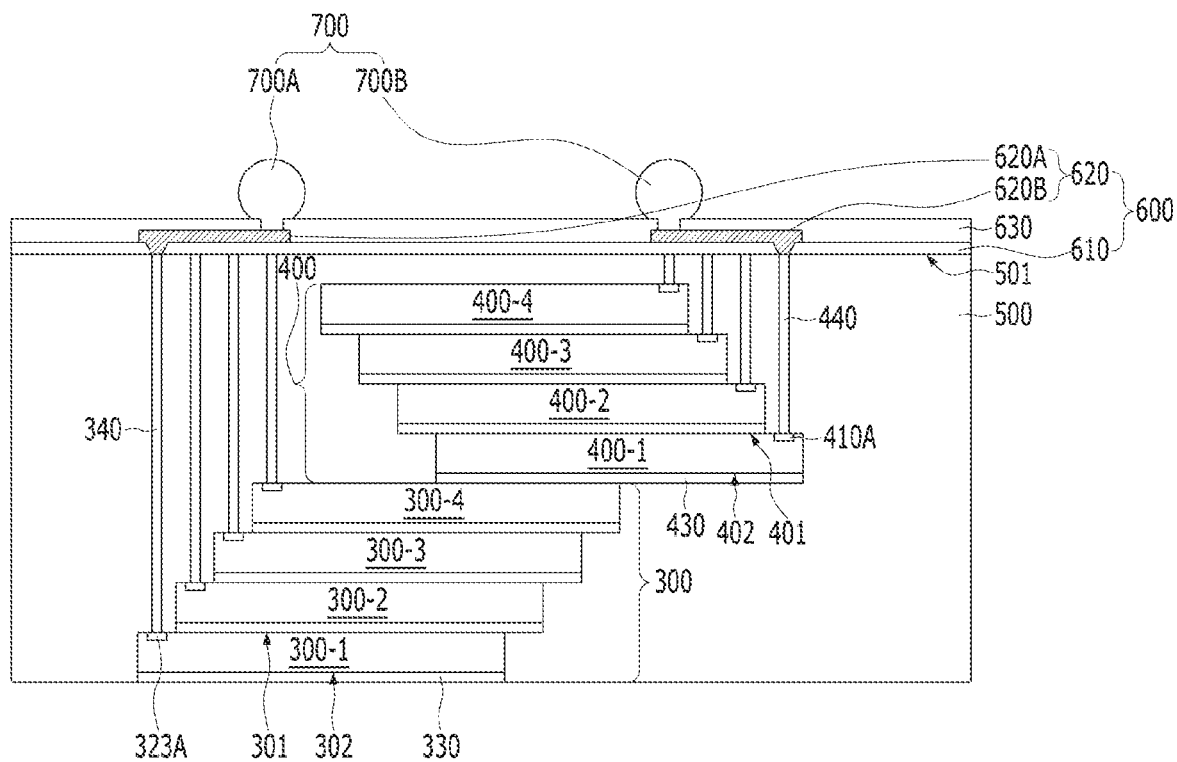

FIGS. 2A, 2B, 3A, 3B, 4A, 4B, 5A, 5B, 6 and 7 are diagrams for describing a semiconductor package and a method for fabricating the same in accordance with an embodiment. For example, FIGS. 2A, 3A, 4A, and 5A are plan views when the semiconductor package is seen in the direction of the active surface. FIGS. 2B, 3B, 4B, and 5B are cross-sectional views corresponding to FIGS. 2A, 3A, 4A, and 5A, respectively. In particular, FIGS. 2B, 3B, 4B, and 5B are cross-sectional views taken along lines A2-A2' of FIGS. 2A, 3A, 4A, and 5A, respectively. FIGS. 6 and 7 are cross-sectional views for describing subsequent processes of a process which is described with reference to FIGS. 5A and 5B. The descriptions of substantially the same components as those described with reference to FIGS. 1A and 1B will be omitted herein.

First, the fabrication method will be described.

Figure 2A:
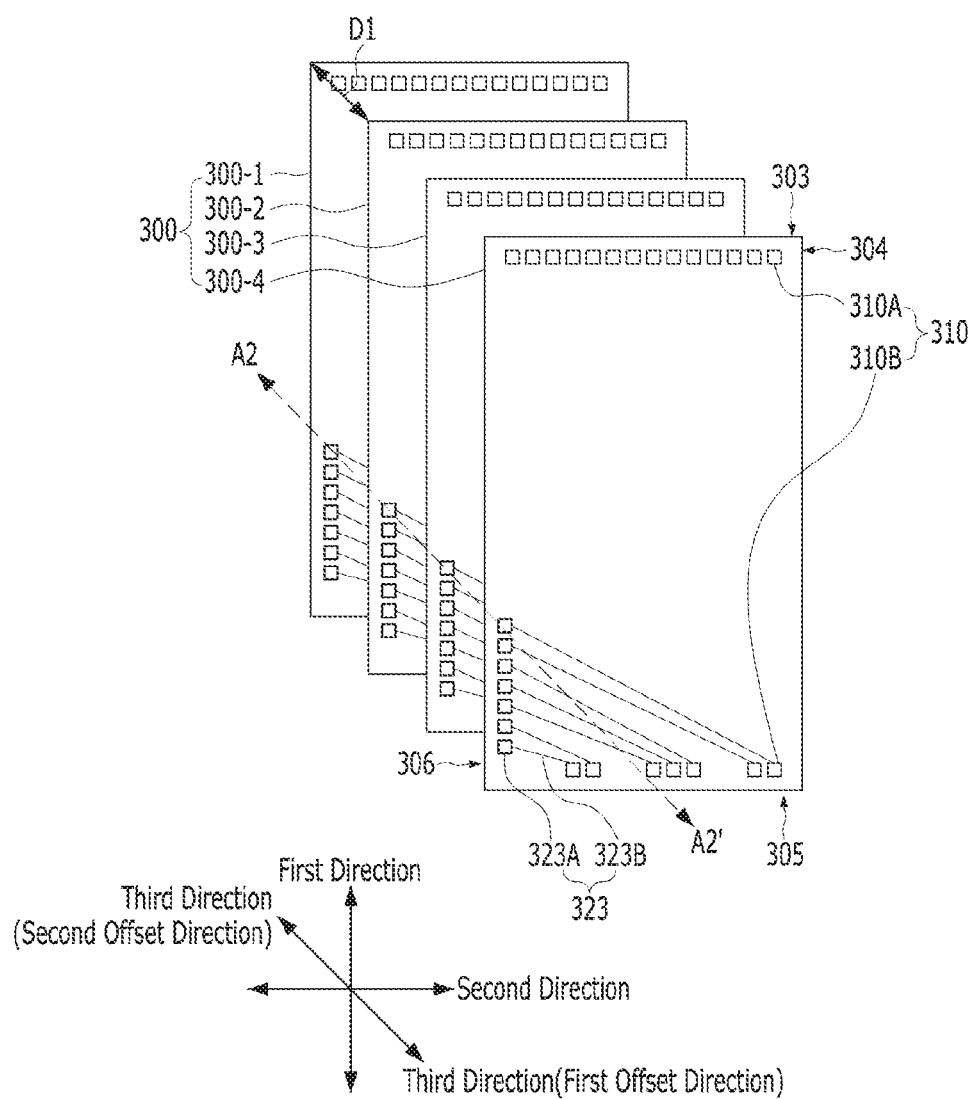
FIGS. 2A, 2B, 3A, 3B, 4A, 4B, 5A, 5B, 6 and 7 are diagrams for describing a semiconductor package and a method for fabricating the same in accordance with an embodiment.
Figure 2B:
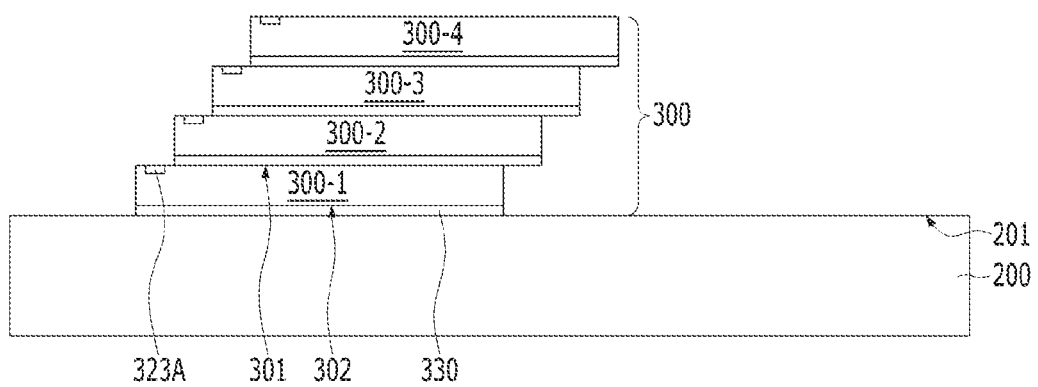

Referring to FIGS. 2A and 2B, a carrier substrate 200 may be provided. The carrier substrate 200 may be a glass carrier substrate, a silicon carrier substrate, a ceramic carrier substrate or the like. Alternatively, the carrier substrate 200 may be a wafer, and a plurality of packages may be simultaneously formed on the carrier substrate 200.

Then, a first chip stack 300 may be formed on a first surface 201 of the carrier substrate 200. The first chip stack 300 may include a plurality of first semiconductor chips 300-1 to 300-4 stacked in a direction perpendicular to the first surface 201 of the carrier substrate 200. In an embodiment, the first chip stack 300 may include four first semiconductor chips 300-1 to 300-4. However, the present embodiments are not limited thereto, but the number of semiconductor chips included in the first chip stack 300 may be set to various values such as, but not limited to, 2 and 8. For convenience of description, the four first semiconductor chips are sequentially represented by reference numerals 300-1 to 300-4 in ascending order of distance from the carrier substrate 200.

Each of the first semiconductor chips 300-1 to 300-4 may have substantially the same structure as the semiconductor chip 100 described with reference to FIGS. 1A and 1B. Thus, each of the first semiconductor chips 300-1 to 300-4 may include chip pads 310, an active surface 301 on which a redistribution conductive layer 323 including redistribution pads 323A and redistribution lines 323B is disposed, an inactive surface 302 positioned in the opposite side of the active surface 301, and first to fourth side surfaces 303, 304, 305, and 306 connecting the active surface 301 and the inactive surface 302. For reference, FIG. 2B is a cross-sectional view taken along the line A2-A2' of FIG. 2A, and the chip pads 310 might not be seen on this cross-sectional view. For convenience of description, illustration of the redistribution lines 323B and the redistribution dielectric layer is omitted from the cross-sectional view of FIG. 2B. However, each of the first semiconductor chips 300-1 to 300-4 may include the same redistribution layer as the chip redistribution layer 120 described with reference to the cross-sectional view of FIG. 1B. The first semiconductor chips 300-1 to 300-4 may be the same memory chips, for example, mobile DRAM chips.

The plurality of first semiconductor chips 300-1 to 300-4 may be stacked on the carrier substrate 200 in such a manner that the inactive surface 302 faces the carrier substrate 200 and the active surface 301 is located on the opposite side of the inactive surface 302. That is, the plurality of first semiconductor chips 300-1 to 300-4 may be stacked in a face-up manner. The inactive surface 302 of each of the first semiconductor chips 300-1 to 300-4 may have an adhesive layer 330 formed thereon. Through the adhesive layer 330, each of the first semiconductor chips 300-1 to 300-4 may be attached to the first semiconductor chip located immediately thereunder or the first surface 201 of the carrier substrate 200. The adhesive layer 330 may include a dielectric adhesive material such as a die attach film (DAF).

The plurality of first semiconductor chips 300-1 to 300-4 may be stacked in such a manner that the one-side chip pads 310A and the redistribution pads 323A of each of the first semiconductor chips 300-1 to 300-4 are all exposed. For example, any one of the first semiconductor chips 300-1 to 300-4 may be stacked with a constant offset from another first semiconductor chip, which is adjacent in the stacking direction, in a predetermined direction parallel to the first surface 201 of the carrier substrate 200. The predetermined direction may indicate a direction away from a first side surface 303 close to the one-side chip pads 310A and a fourth side surface 306 close to the redistribution pads 323A, among third directions crossing the first and second directions. The predetermined direction will be hereafter referred to as a first offset direction. Hereafter, the offset between the first semiconductor chips 300-1 to 300-4 adjacent to each other will be referred to as a first offset D1. The first offset D1 may be constant or not, but needs to have a value capable of exposing at least the one-side chip pads 310A and the redistribution pads 323A. The cross-sectional view of FIG. 2B, taken in the third direction, illustrates the first chip stack 300 having a stair shape as a whole.

As the first semiconductor chips are offset-stacked, the one-side chip pads 310A and the redistribution pads 323A of the lowermost first semiconductor chip 300-1 might not be covered by the other first semiconductor chips 300-2 to 300-4, but exposed to the outside.

Similarly, the one-side chip pads 310A and the redistribution pads 323A of the first semiconductor chip 300-2 located at the second place from the bottom might not be covered by the first semiconductor chips 300-3 and 300-4 located over the first semiconductor chip 300-2, but exposed to the outside, and the one-side chip pads 310A and the redistribution pads 323A of the first semiconductor chip 300-3 located at the third place from the bottom might not be covered by the first semiconductor chip 300-4 located on the first semiconductor chip 300-3 but exposed to the outside. Since the uppermost first semiconductor chip 300-4 is located at the uppermost part of the first chip stack 300, the uppermost first semiconductor chip 300-4 may be always exposed regardless of the stack structure, if the semiconductor package includes only the first chip stack 300. In this case, the redistribution pads 323A and the redistribution lines 323B of the uppermost first semiconductor chip 300-4 may be omitted. As will be described below, however, when another semiconductor chip, for example, a second semiconductor chip 400-1 of FIGS. 3A and 3B is located on the first semiconductor chip 300-4, the first semiconductor chip 300-4 may include the redistribution pads 323A and the redistribution lines 323B like the other first semiconductor chips 300-1 to 300-3.

Figure 3A:
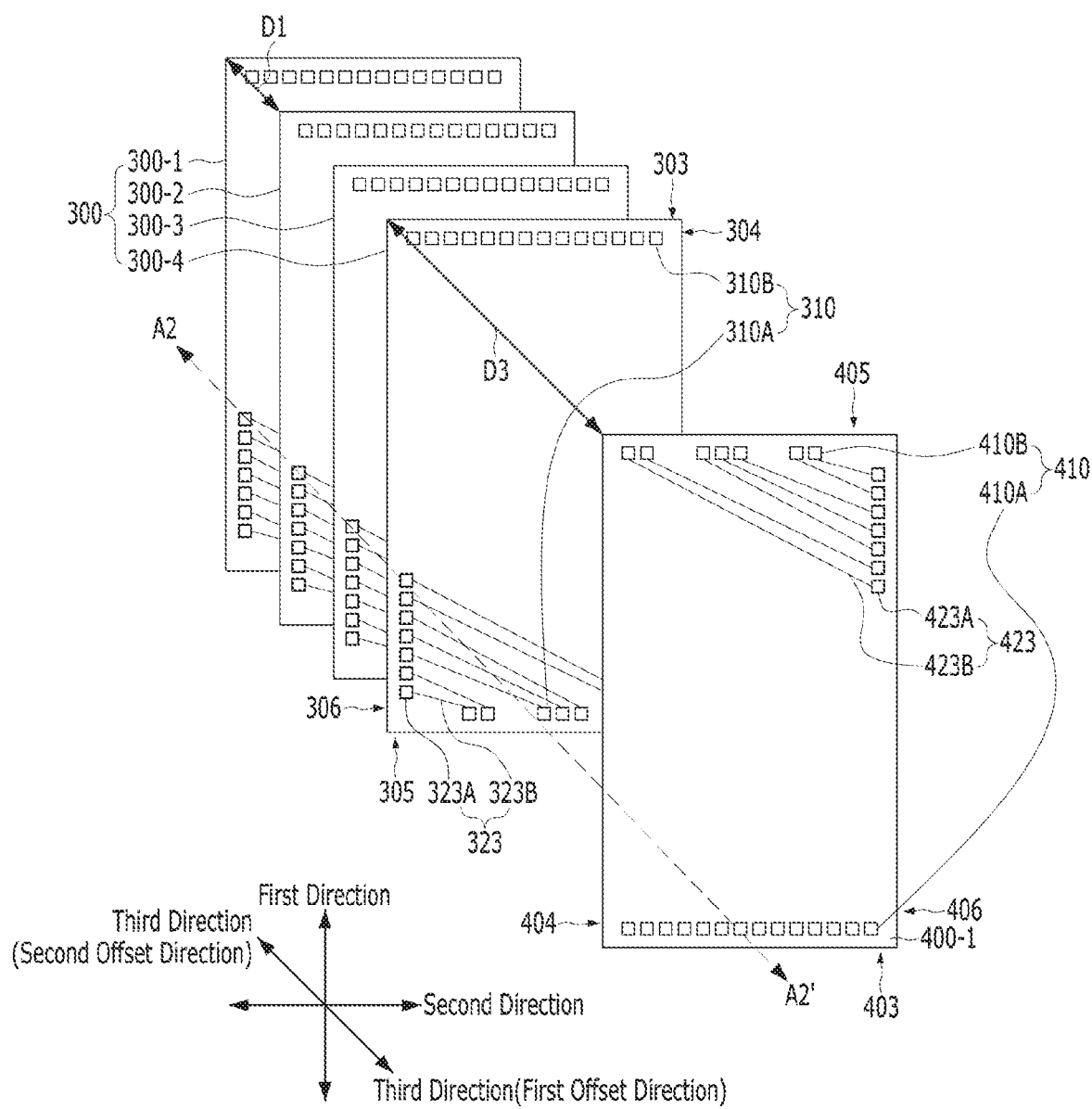
Figure 3B:
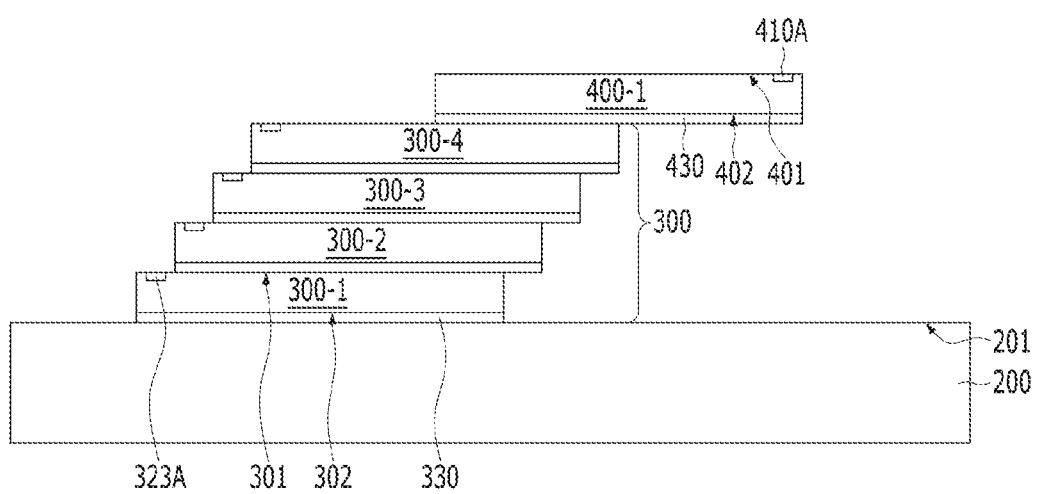

Then, referring to FIGS. 3A, 3B, 4A, and 4B, a second chip stack 400 may be formed on the first chip stack 300. For reference, FIGS. 3A and 3B illustrate only the second semiconductor chip 400-1 located at the lowermost part among second semiconductor chips 400-1 to 400-4 included in the second chip stack 400, for description. FIGS. 4A and 4B illustrate the entire second chip stack 400.

The second chip stack 400 may include the plurality of second semiconductor chips 400-1 to 400-4 stacked in the vertical direction. The number of the second semiconductor chips 400-1 to 400-4 included in the second chip stack 400 may be set to four which is equal to the number of the first semiconductor chips 300-1 to 300-4 included in the first chip stack 300. However, the present embodiments are not limited thereto, but the number of the semiconductor chips included in the second chip stack 400 may be set to various values such as, but not limited to, 2 and 8. The number of the semiconductor chips included in the second chip stack 400 may be different from the number of the semiconductor chips included in the first chip stack 300. For convenience of description, the four second semiconductor chips are sequentially represented by reference numerals 400-1 to 400-4 in ascending order of distance from the carrier substrate 200.

Each of the second semiconductor chips 400-1 to 400-4 may have substantially the same structure as the semiconductor chip 100 of FIGS. 1A and 1B and/or each of the first semiconductor chips 300-1 to 300-4. Thus, each of the second semiconductor chips 400-1 to 400-4 may include chip pads 410, an active surface 401 on which a redistribution conductive layer 423 including redistribution pads 423A and redistribution lines 423B is disposed, an inactive surface 402 located on the opposite side of the active surface 401, and first to fourth side surfaces 403 to 406 connecting the active surface 401 and the inactive surface 402.

However, each of the second semiconductor chips 400-1 to 400-4 may be stacked in the same state as the state in which the semiconductor chip 100 is rotated by 180 degrees about one axis in a direction parallel to the side surfaces 103 to 106 of the semiconductor chip 100, i.e. a direction passing through the active surface 101 and the inactive surface 102. Therefore, the first to fourth side surfaces 403 to 406 of each of the second semiconductor chips 400-1 to 400-4 may be located at the opposite positions of the positions of the first to fourth side surfaces 303 to 306 of each of the first semiconductor chips 300-1 to 300-4, respectively. That is, under the supposition that the first to fourth side surfaces 303 to 306 of each of the first semiconductor chips 300-1 to 300-4 are located on the top, right, bottom and left sides on a plane, respectively, the first to fourth side surfaces 403 to 406 of each of the second semiconductor chips 400-1 to 400-4 may be located on the bottom, left, top and right sides on the plane, respectively. Furthermore, the chip pads 410 and the redistribution conductive layers 423 of the second semiconductor chips 400-1 to 400-4 may also be located at the opposite positions of the positions of the chip pads 310 and the redistribution conductive layers 323 of the first semiconductor chips 300-1 to 300-4. That is, under the supposition that the one-side chip pads 310A and the other-side chip pads 310B of the first semiconductor chips 300-1 to 300-4 are located at the top and bottom edge areas on the plane and the redistribution pads 323A are located close to the bottom side at the left edge area on the plane, the one-side chip pads 410A and the other-side chip pads 410B of the second semiconductor chips 400-1 to 400-4 may be located at the bottom and top edge areas on the plane, and the redistribution pads 423A may be located close to the top side at the right edge area on the plane.

For reference, FIGS. 3B and 4B are cross-sectional views taken along the line A2-A2' like FIG. 2B. Unlike the first semiconductor chips 300-1 to 300-4, the one-side chip pads 410A of the second semiconductor chips 400-1 to 400-4 may be seen on the cross-sectional views, and the other-side chip pads 410B and the redistribution pads 423A might not be seen on the cross-sectional views. For convenience of description, illustration of the redistribution lines 423B and the redistribution dielectric layer is omitted from the cross-sectional views of FIGS. 3B and 4B. However, each of the second semiconductor chips 400-1 to 400-4 may include the same redistribution layer as the chip redistribution layer 120 described with reference to the cross-sectional view of FIG. 1B.

The second semiconductor chips 400-1 to 400-4 may be the same memory chips, for example, mobile DRAM chips. The second semiconductor chips 400-1 to 400-4 may be the same memory chips as the first semiconductor chips 300-1 to 300-4.

The plurality of second semiconductor chips 400-1 to 400-4 may be stacked on the first chip stack 300 in such a manner that the inactive surface 402 faces the carrier substrate 200 and the active surface 401 is located on the opposite side of the inactive surface 402. That is, the plurality of second semiconductor chips 400-1 to 400-4 may be stacked in a face-up manner. The inactive surface 402 of each of the second semiconductor chips 400-1 to 400-4 may have an adhesive layer 430 formed thereon. Through the adhesive layer 430, each of the second semiconductor chips 400-1 to 400-4 may be attached to the second semiconductor chip located immediately thereunder or the active surface 301 of the uppermost first semiconductor chip 300-4 of the first chip stack 300. The adhesive layer 430 may include a dielectric adhesive material such as a DAF.

The plurality of second semiconductor chips 400-1 to 400-4 may be stacked in such a manner that the one-side chip pads 410A and the redistribution pads 423A of each of the second semiconductor chips 400-1 to 400-4 are all exposed. For example, any one of the second semiconductor chips 400-1 to 400-4 may be stacked with a constant offset from another second semiconductor chip, which is adjacent in the stacking direction, in a predetermined direction parallel to the first surface 201 of the carrier substrate 200. The predetermined direction may indicate a direction away from the first side surface 403 close to the one-side chip pads 410A and the fourth side surface 406 close to the redistribution pads 423A, among the third directions crossing the first and second directions. The predetermined direction will be hereafter referred to as a second offset direction. Since the one-side chip pads 410A and the redistribution pads 423A of the second semiconductor chips 400-1 to 400-4 are located on the opposite side of the one-side chip pads 310A and the redistribution pads 323A of the first semiconductor chips 300-1 to 300-4, respectively, the second offset direction may face the opposite direction of the first offset direction. For example, when the first offset direction faces between the right and bottom sides, the second offset direction may face between the top and left sides while being parallel to the first offset direction. Hereafter, the offset between the second semiconductor chips 400-1 to 400-4 adjacent to each other will be referred to as a second offset D2. The second offset D2 may be constant or not, but needs to have a value capable of exposing at least the one-side chip pads 410A and the redistribution pads 423A. In an embodiment, the second offset D2 may be equal to the first offset D1. In other embodiments, however, the second offset D2 may be different from the first offset D1. FIG. 4B, which is a cross-sectional view taken in the third direction, shows the second chip stack 400 having a stair shape facing the opposite direction of the first chip stack 300.

As the second semiconductor chips are offset-stacked, the one-side chip pads 410A and the redistribution pads 423A of the lowermost second semiconductor chip 400-1 might not be covered by the other second semiconductor chips 400-2 to 400-4, but exposed to the outside. Similarly, the one-side chip pads 410A and the redistribution pads 423A of the second semiconductor chip 400-2 located at the second place from the bottom might not be covered by the second semiconductor chips 400-3 and 400-4 located on the second semiconductor chip 400-2, but exposed to the outside, and the one-side chip pads 410A and the redistribution pads 423A of the second semiconductor chip 400-3 located at the third place from the bottom might not be covered by the second semiconductor chip 400-4 located on the second semiconductor chip 400-3, but exposed to the outside. Since the uppermost second semiconductor chip 400-4 is located at the uppermost part of the second chip stack 400, the redistribution layer including the redistribution pads 423A and the redistribution lines 423B may be omitted from the uppermost second semiconductor chip 400-4 as illustrated in FIG. 4A, when the semiconductor package includes only the first and second chip stacks 300 and 400 and no other electronic elements are disposed on the second chip stack 400. However, when an electronic element (not illustrated) such as another semiconductor chip is disposed on the second chip stack 400, the uppermost second semiconductor chip 400-4 may include the redistribution pads 423A and the redistribution lines 423B like the other second semiconductor chips 400-1 to 400-3.

One-side chip pads 310A and the redistribution pads 323A of the first semiconductor chips 300-1 to 300-4 may be exposed. That is, one-side chip pads 310A and the redistribution pads 323A of the first semiconductor chips 300-1 to 300-4 may not covered by the second chip stack 400. This is in order to form vertical interconnectors on the one-side chip pads 310A and the redistribution pads 323A to be extended in the vertical direction, as will be described below. Meanwhile, since the offset stacking direction of the second chip stack 400 is opposite to the offset stacking direction of the first chip stack 300, the second chip stack 400 is likely to cover at least some of the one-side chip pads 310A and the redistribution pads 323A of the first semiconductor chips 300-1 to 300-4. In some embodiments, in order to prevent such a risk, a distance D3 between the lowermost second semiconductor chip 400-1 of the second chip stack 400 and the uppermost first semiconductor chip 300-4 of the first chip stack 300 in the third direction may be increased as much as possible. Furthermore, the second offset D2 may be reduced as much as possible. In other embodiments, in order to prevent such a risk, a distance D3 between the lowermost second semiconductor chip 400-1 of the second chip stack 400 and the uppermost first semiconductor chip 300-4 of the first chip stack 300 in the third direction may be increased to allow the vertical interconnectors on the one-side chip pads 310A and the redistribution pads 323A to be extended in the vertical direction. Furthermore, in these other embodiments, the second offset D2 may be reduced to allow the vertical interconnectors on the one-side chip pads 310A and the redistribution pads 323A to be extended in the vertical direction.

However, when the distance D3 is excessively increased, the second chip stack 400 might not be reliably supported by the first chip stack 300, but tilted to one side. In order to prevent such a tilt, the distance D3 may be properly adjusted, or a support structure (not illustrated) having substantially the same thickness as the first chip stack 300 may be formed under the second chip stack 400.

In this way, the first and second chip stacks 300 and 400 may be formed in an arrow shape facing the first offset direction over the carrier substrate 200. In this state, the one-side chip pads 310A and the redistribution pads 323A of the first semiconductor chips 300-1 to 300-4 of the first chip stack 300 may be all exposed, and the one-side chip pads 410A and the redistribution pads 423A of the second semiconductor chips 400-1 to 400-3 of the second chip stack 400 except the uppermost second semiconductor chip 400-4 may be all exposed. Since the entire active surface 401 of the uppermost second semiconductor chip 400-4 is exposed, all of the chip pads 410 may be exposed.

Referring to FIGS. 5A and 5B, first vertical interconnectors 340 may be formed on the one-side chip pads 310A and the redistribution pads 323A of the first semiconductor chips 300-1 to 300-4 and extended in the vertical direction while connected to the one-side chip pads 310A and the redistribution pads 323A, respectively. Second vertical interconnectors 440 may be formed on the one-side chip pads 410A and the redistribution pads 423A of the second semiconductor chips 400-1 to 400-3 and the chip pads 410 of the uppermost second semiconductor chip 400-4 of the second chip stack 400, and extended in the vertical direction while connected to the one-side chip pads 410A, the redistribution pads 423A and the chip pads 410, respectively.

The first and second vertical interconnectors 340 and 440 may be bonding wires, for example. When the first and second vertical interconnectors 340 and 440 are bonding wires, a process of forming the first and second vertical interconnectors 340 and 440 will be briefly described as follows. For example, the process of forming the first vertical interconnectors 340 connected to the one-side chip pads 310A will be described. First, one end of a wire may be bonded to the one-side chip pad 310A by a wire bonding machine (not illustrated). The wire may include metals, such as gold, silver, copper and platinum, or alloys thereof, which can be welded to the one-side chip pad 310A by ultrasonic energy and/or heat. Then, the other end of the wire may be pulled in the vertical direction away from the carrier substrate 200, for example, from bottom to top by the wire bonding machine. Subsequently, when the other end of the wire is extended to a desired position, the other end of the wire may be cut. In this way, the first vertical interconnector 340 may be formed, which has a first end (for example, a lower end) bonded to the one-side chip pad 310A and a second end (for example, an upper end) located at a predetermined distance from the first surface 201 of the carrier substrate 200. The predetermined distance may have a larger value than a distance from the first surface 201 of the carrier substrate 200 to the top surface of the second chip stack 400. That is, a distance from the bottom surface of the first chip stack 300 to the second ends of the first and second vertical interconnectors 340 and 440 is larger than a distance from the bottom surface of the first chip stack 300 to the top surface of the second chip stack 400.

The second vertical interconnector 440 connected to each of the chip pads 410 of the second semiconductor chip 400-4 located at the uppermost part of the second chip stack 400 may be another type of interconnector instead of a bonding wire. For example, the second vertical interconnector 440 connected to each of the chip pads 410 of the second semiconductor chip 400-4 may be various types of bumps such as a stud bump and a pillar bump. The bump may include metals such as copper, silver, tin and lead.

Referring to FIG. 6, a molding layer 500 may be formed on the carrier substrate 200 on which the first and second chip stacks 300 and 400 and the first and second vertical interconnectors 340 and 440 are formed.

The molding layer 500 may be formed through a molding process of filling an empty space of a molding die (not illustrated) with a molding material and then curing the molding material. The molding material may include thermosetting resin, for example, epoxy mold compound (EMC).

The molding layer 500 may be formed to expose the other ends of the first and second vertical interconnectors 340 and 440, for example, the upper ends, while covering the first and second chip stacks 300 and 400 and the first and second vertical interconnectors 340 and 440. For this structure, after the molding layer 500 is formed to such a thickness that covers the first and second chip stacks 300 and 400 and the first and second vertical interconnectors 340 and 440, a grinding process may be performed on the molding layer 500. The grinding process may include a mechanical or chemical polishing process. Alternatively, by adjusting the shapes of the first and second vertical interconnectors 340 and 440 and/or the shape of the molding die without the grinding process, the other ends of the first and second vertical interconnectors 340 and 440 may be exposed.

Thus, the molding layer 500 may have a first surface 501 formed at substantially the same level as the other ends of the first and second vertical interconnectors 340 and 440, and the other ends of the first and second vertical interconnectors 340 and 440 may be exposed through the first surface 501.

Referring to FIG. 7, a package redistribution layer 600 may be formed on the first surface 501 of the molding layer 500. In order to distinguish from the redistribution layers 120, 323 and 423 formed in the above-described semiconductor chips, the redistribution layer formed on the first surface 501 of the molding layer 500 is referred to as the package redistribution layer 600.

The formation process of the package redistribution layer 600 will be described as follows. First, a first redistribution dielectric layer 610 may be formed on the first surface 501 of the molding layer 500. The first redistribution dielectric layer 610 may be patterned to have openings that expose the other ends of the first and second vertical interconnectors 340 and 440, respectively. Then, a redistribution conductive layer 620 may be formed on the first redistribution dielectric layer 610. The redistribution conductive layer 620 may fill the openings of the first redistribution dielectric layer 610 to be electrically coupled to the other ends of the first and second vertical interconnectors 340 and 440, and patterned in various shapes. The redistribution conductive layer 620 connected to the first vertical interconnectors 340 will be referred to as a first redistribution conductive layer 620A, and the redistribution conductive layer 620 connected to the second vertical interconnectors 440 will be referred to as a second redistribution conductive layer 620B. Then, a second redistribution dielectric layer 630 may be formed on the first redistribution dielectric layer 610 and the redistribution conductive layer 620. The second redistribution dielectric layer 630 may be patterned to have openings that expose portions of the redistribution conductive layer 620.

Subsequently, external connection terminals 700 may be formed on the package redistribution layer 600 to be electrically coupled to the redistribution conductive layer 620 through the openings of the second redistribution dielectric layer 630. In an embodiment, solder balls may be used as the external connection terminals 700. However, the present embodiments are not limited thereto, but various types of electrical connectors may be used as the external connection terminals 700. The external connection terminals 700 may include a first external connection terminal 700A connected to the first redistribution conductive layer 620A and a second external connection terminal 700B connected to the second redistribution conductive layer 620B.

Then, the carrier substrate 200 may be removed. The carrier substrate 200 may be removed at any time after the molding layer 500 is formed.

Through the above-described process, the semiconductor package illustrated in FIG. 7 may be fabricated.

Referring back to FIG. 5A with FIG. 7, the semiconductor package in accordance with an embodiment may include the first chip stack 300, the first vertical interconnectors 340, the second chip stack 400 and the second vertical interconnectors 440. The first chip stack 300 may include the plurality of first semiconductor chips 300-1 to 300-4 stacked in the vertical direction, and the first vertical interconnectors 340 may be electrically coupled to the plurality of first semiconductor chips 300-1 to 300-4, respectively, and extended in the vertical direction. The second chip stack 400 may be disposed on the first chip stack 300 and include the plurality of second semiconductor chips 400-1 to 400-4 stacked in the vertical direction, and the second vertical interconnectors 440 may be electrically coupled to the plurality of second semiconductor chips 400-1 to 400-4, respectively, and extended in the vertical direction.

Each of the first semiconductor chips 300-1 to 300-4 may include the active surface 301, one-side first chip pads 310A, other-side first chip pads 310B, and first redistribution pads 323A. The active surface 301 may be defined by both side surfaces in the first direction and both side surfaces in the second direction. The one-side first chip pads 310A may be disposed at an edge of the active surface 301, which is close to one side surface in the first direction, and the other-side first chip pads 310B may be disposed at an edge of the active surface 301, which is close to the other side surface in the first direction. The first redistribution pads 323A may be electrically coupled to the other-side first chip pads 310B and disposed at an edge of the active surface 301, which is close to one side surface between both side surfaces in the second direction.

The plurality of first semiconductor chips 300-1 to 300-4 may be offset-stacked in the third direction crossing the first and second directions, such that the one-side first chip pads 310A and the first redistribution pads 323A are exposed. For example, the plurality of first semiconductor chips 300-1 to 300-4 may be stacked with an offset in a direction away from the one side surface in the first direction and the one side surface in the second direction.

The first vertical interconnectors 340 may have one ends connected to the exposed one-side first chip pad 310A and the exposed first redistribution pad 323A.

Each of the second semiconductor chips 400-1 to 400-4 may be stacked in the same state as the state in which any one of the first semiconductor chips 300-1 to 300-4 is rotated by 180 degrees about one axis parallel to the vertical direction. Thus, the second semiconductor chip may include one-side second chip pads 410A, other-side second chip pads 410B and second redistribution pads 423A, which are located at the opposite positions of the positions of the one-side first chip pads 310A, the other-side first chip pads 310B and the first redistribution pads 323A. However, since the uppermost second semiconductor chip 400-4 does not need the second redistribution pads 423A, the second redistribution pads 423A may be omitted from the uppermost second semiconductor chip 400-4.

The plurality of second semiconductor chips 400-1 to 400-4 may be offset-stacked in the third direction such that the one-side second chip pads 410A and the second redistribution pads 423A are exposed. For example, the plurality of second semiconductor chips 400-1 to 400-4 may be offset-stacked in the opposite direction of the offset stacking direction of the first semiconductor chips 300-1 to 300-4.

The second vertical interconnector 440 may have one end connected to the one-side second chip pad 410A and the second redistribution pad 423A. However, when the second redistribution pads 423A are omitted from the uppermost second semiconductor chip 400-4, the second vertical interconnector 440 connected to the uppermost second semiconductor chip 400-4 may have one end connected to the one-side second chip pad 410A and the other-side second chip pad 410B.

The semiconductor package in accordance with an embodiment may further include the molding layer 500 covering the first and second chip stacks 300 and 400 and the package redistribution layer 600 and the external connection terminals 700 which are formed on the first surface 501 of the molding layer 500. Since the package redistribution layer 600 can be formed in the area defined by the molding layer 500, the semiconductor package in accordance with an embodiment may be a fan-out semiconductor package.

The first chip stack 300 may be recognized as one semiconductor chip while connected to an external component through the first vertical interconnector 340, the first redistribution conductive layer 620A and the first external connection terminal 700A, which are connected thereto. The second chip stack 400 may be recognized as another semiconductor chip different from the first chip stack 300, while connected to an external component through the second vertical interconnector 440, the second redistribution conductive layer 620B and the second external connection terminal 700B, which are connected thereto. That is, the electrical path through the first chip stack 300, the first vertical interconnector 340, the first redistribution conductive layer 620A and the first external connection terminal 700A may be electrically isolated from and recognized as a separate path from the electrical path through the second chip stack 400, the second vertical interconnector 440, the second redistribution conductive layer 620B and the second external connection terminal 700B.

Since the components of the semiconductor package have been already described while the fabrication method is described, the detailed descriptions thereof are omitted herein.

The semiconductor package and the method for fabricating the same, which have been described so far, may acquire the following effects.

First, the semiconductor package including the plurality of stacked semiconductor chips can be formed to satisfy high-performance/high-capacity requirements. Furthermore, the fan-out semiconductor package using the redistribution layer instead of the existing substrate can be formed through the vertical wires, which makes it possible to implement the semiconductor package with a small thickness.

Furthermore, the semiconductor package and the fabrication method can solve a problem in which it is difficult to stack semiconductor chips while exposing all chip pads disposed at both edges thereof, when the semiconductor chips include the chip pads disposed at both edges thereof. For example, the redistribution layer may be added to the semiconductor chips, and the plurality of semiconductor chips may be offset-stacked in a diagonal direction, in order to solve the problem. In particular, the redistribution layer connected only to the chip pads disposed at one edge of the semiconductor chip between both edges thereof may be formed, which makes it possible to reduce the process cost or to lower the difficulty level of the process, due to the formation of the redistribution layer.

In an embodiment, the case in which the semiconductor package includes two chip stacks stacked in the vertical direction, i.e. the first and second chip stacks 300 and 400 has been described. However, the semiconductor package may include only any one of the first and second chip stacks 300 and 400, and one or more chip stacks may be further disposed on the second chip stack 400.

When the semiconductor package includes only one chip stack, the redistribution layer of the uppermost semiconductor chip may be omitted. Thus, the vertical interconnectors connected to the uppermost semiconductor chip may be connected to the one-side chip pads and the other-side chip pads, respectively. Furthermore, the vertical interconnectors connected to the uppermost semiconductor chip may be conductive bumps, and the vertical interconnectors connected to the other semiconductor chips may be bonding wires.

When the semiconductor package includes three or more chip stacks, structures similar to the first and second chip stacks 300 and 400 may be repeatedly stacked over the first and second chip stacks 300 and 400. Among the semiconductor chip stacks, only the redistribution layer of the uppermost semiconductor chip of the uppermost chip stack may be omitted, and the other semiconductor chips may include the redistribution layer. Three or more chip stacks may be stacked while the offset directions thereof are alternately changed to expose all of the one-side chip pads and the redistribution pads of the semiconductor chips except the uppermost semiconductor chip.

Since the case in which the semiconductor package includes only one chip stack or three or more chip stacks can be easily derived from the descriptions of the above-described embodiments, the detailed descriptions thereof are omitted herein.

In accordance with the present embodiments, it is possible to provide a semiconductor package which has a small thickness and can satisfy high-performance and high-capacity requirements through the method for stacking a plurality of semiconductor chips each having chip pads disposed at both edges thereof.

Figure 8:
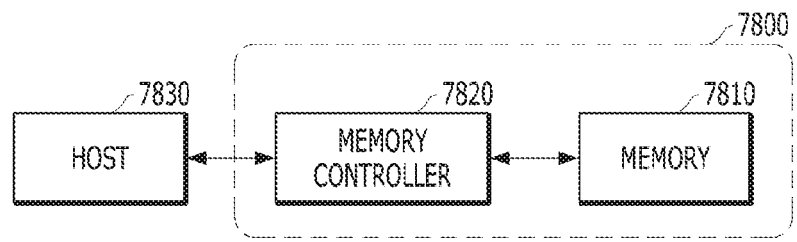
FIG. 8 shows a block diagram illustrating an electronic system including a memory card 7800 employing at least one of the semiconductor packages according to the embodiments.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
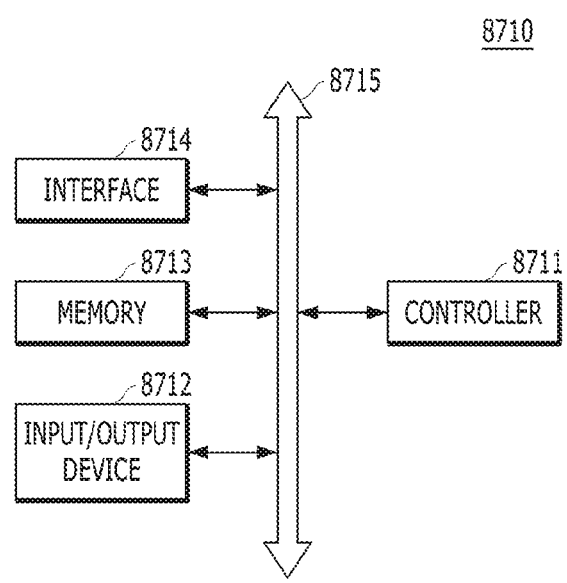
FIG. 9 shows a block diagram illustrating an electronic system 8710 including at least one of the semiconductor packages according to described embodiments.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A semiconductor package comprising:
a first chip stack including a plurality of first semiconductor chips stacked in a vertical direction; and
first vertical interconnectors electrically coupled to the plurality of first semiconductor chips, respectively, and extended in the vertical direction,
wherein each of other first semiconductor chips, except at least an uppermost first semiconductor chip from among the plurality of first semiconductor chips includes:
an active surface defined by first and third side surfaces in a first direction and second and fourth side surfaces in a second direction crossing the first direction;
first one-side chip pads disposed at a first edge of the active surface, which is close to the first side surface;
first other-side chip pads disposed at a third edge of the active surface, which is close to the third side surface; and
first redistribution pads electrically coupled to the first other-side chip pads, and disposed at a fourth edge of the active surface, which is close to the fourth side surface, and
wherein the plurality of first semiconductor chips are stacked with an offset toward one side in a third direction crossing the first and second directions, the one side being away from the first side surface and the fourth side surface, in order to expose the first one-side chip pads and the first redistribution pads and cover the first other-side chip pads,
wherein one ends of the first vertical interconnectors, electrically coupled to the other first semiconductor chips, are respectively connected to the first one-side chip pads and the first redistribution pads.

2. The semiconductor package of claim 1, wherein the uppermost first semiconductor chip has the first one-side chip pads and the first other-side chip pads, except for the first redistribution pads.

3. The semiconductor package of claim 2, wherein one ends of the first vertical interconnectors, electrically coupled to the uppermost first semiconductor chip, are respectively connected to the first one-side chip pads and the first other-side chip pads of the uppermost first semiconductor chip.

4. The semiconductor package of claim 3, wherein the first vertical interconnectors, electrically coupled to the uppermost first semiconductor chip, comprise conductive bumps, and
the first vertical interconnectors, electrically coupled to the other first semiconductor chips, comprise bonding wires.

5. The semiconductor package of claim 1, wherein the plurality of first semiconductor chips comprise the same memory chips.

6. The semiconductor package of claim 1, wherein the number of the first other-side chip pads is smaller than the number of the first one-side chip pads.

7. The semiconductor package of claim 1, wherein, for each of the other first semiconductor chips, the first redistribution pads are disposed closer to the first other-side chip pads than the first one-side chip pads.

8. A semiconductor package comprising:
a first chip stack including a plurality of first semiconductor chips stacked in a vertical direction;
first vertical interconnectors electrically coupled to the plurality of first semiconductor chips, respectively, and extended in the vertical direction;
a second chip stack disposed on the first chip stack, and comprising a plurality of second semiconductor chips stacked in the vertical direction, the second semiconductor chips including other second semiconductor chips and an uppermost second semiconductor chip; and
second vertical interconnectors electrically coupled to the plurality of second semiconductor chips, respectively, and extended in the vertical direction,
wherein each of the plurality of first semiconductor chips includes:

an active surface defined by first and third side surfaces in a first direction and second and fourth side surfaces in a second direction crossing the first direction;

first one-side chip pads disposed at a first edge of the active surface, which is close to the first side surface;

first other-side chip pads disposed at a third edge of the active surface, which is close to the third side surface; and first redistribution pads electrically coupled to the first other-side chip pads and disposed at a fourth edge of the active surface, which is close to the fourth side surface, wherein the plurality of first semiconductor chips are stacked with an offset toward one side in a third direction crossing the first and second directions, the one side being spaced away from the first side surface and the fourth side surface, in order to expose the first one-side chip pads and the first redistribution pads and cover the first other-side chip pads, wherein one ends of the first vertical interconnectors are respectively connected to the first one-side chip pads and the first redistribution pads, wherein the other second semiconductor chips are disposed in the same state as a state in which other first semiconductor chips, except for an uppermost first semiconductor chip, are but rotated by 180 degrees about one axis parallel to the vertical direction, and each of the other second semiconductor chips comprises second one-side chip pads, second other-side chip pads and second redistribution pads which are located at opposite positions of the first one-side chip pads, the first other-side chip pads and the first redistribution pads, respectively, wherein the plurality of second semiconductor chips are stacked with an offset in an opposite direction of an offset stacking direction of the plurality of first semiconductor chips, in order to expose the second one-side chip pads and the second redistribution pads and cover the second other-side chip pads, and wherein one ends of second vertical interconnectors, electrically coupled to the other second semiconductor chips, are respectively connected to the second one-side chip pads and the second redistribution pads.

9. The semiconductor package of claim 8, wherein the uppermost second semiconductor chip has the second one-side chip pads and the second other-side chip pads, except for the second redistribution pads.

10. The semiconductor package of claim 9, wherein one ends of the second vertical interconnectors, electrically coupled to the uppermost second semiconductor chip, are respectively connected to the second one-side chip pads and the second other-side chip pads of the uppermost second semiconductor chip.

11. The semiconductor package of claim 8, wherein the second vertical interconnectors, electrically coupled to the uppermost second semiconductor chip, comprise conductive bumps, and the first and second vertical interconnectors, electrically coupled to the plurality of first semiconductor chips and the other second semiconductor chips, comprise bonding wires.

12. The semiconductor package of claim 8, wherein the plurality of first and second semiconductor chips comprise the same memory chips.

13. The semiconductor package of claim 8, wherein the number of the first other-side chip pads is smaller than the number of the first one-side chip pads, and the number of the second other-side chip pads is smaller than the number of the second one-side chip pads.

14. The semiconductor package of claim 8, wherein the first redistribution pads are disposed closer to the first other-side chip pads than the first one-side chip pads, and the second redistribution pads are disposed closer to the second other-side chip pads than the second one-side chip pads.

15. The semiconductor package of claim 8, wherein the second chip stack is disposed to expose the first one-side chip pads and the first redistribution pads of the first chip stack.

16. The semiconductor package of claim 8, further comprising a molding layer exposing other ends of the first and second vertical interconnectors while covering the first and second chip stacks and the first and second vertical interconnectors.

17. The semiconductor package of claim 16, further comprising a redistribution layer disposed on the molding layer and comprising a first redistribution conductive layer and a second redistribution conductive layer which are connected to the other ends of the first and second vertical interconnectors, respectively.

18. The semiconductor package of claim 17, further comprising a first external connection terminal and a second external connection terminal which are formed on the redistribution layer, and connected to the first and second redistribution conductive layers, respectively.

19. The semiconductor package of claim 18, wherein an electrical path through the first chip stack, the first vertical interconnector, the first redistribution conductive layer and the first external connection terminal is isolated from an electrical path through the second chip stack, the second vertical interconnector, the second redistribution conductive layer and the second external connection terminal.

20. The semiconductor package of claim 8, wherein a distance from a bottom surface of the first chip stack to other ends of the first and second vertical interconnectors is larger than a distance from the bottom surface of the first chip stack to a top surface of the second chip stack.

* * * * *